United States Patent [19]

Meulenberg, Jr. et al.

[11] 4,072,541
[45] Feb. 7, 1978

[54] RADIATION HARDENED P-I-N AND N-I-P SOLAR CELLS

[75] Inventors: Andrew Meulenberg, Jr.; John Harvey Reynolds, both of Gaithersburg, Md.

[73] Assignee: Communications Satellite Corporation, Washington, D.C.

[21] Appl. No.: 774,164

[22] Filed: Mar. 3, 1977

Related U.S. Application Data

[63] Continuation-in-part of Ser. No. 634,221, Nov. 21, 1975, abandoned.

[51] Int. Cl.² .......................................... H01L 31/06
[52] U.S. Cl. .......................... 136/89 SJ; 136/89 CC; 357/30; 357/58
[58] Field of Search ................... 136/89 CC, 89 SJ; 357/30, 58

[56] References Cited

U.S. PATENT DOCUMENTS

| | | | |
|---|---|---|---|
| 2,986,591 | 5/1961 | Swanson et al. | 136/89 |
| 3,150,999 | 9/1964 | Rudenberg et al. | 136/89 |
| 3,615,853 | 10/1971 | Paine | 136/89 |
| 3,811,954 | 5/1974 | Lindmayer | 136/89 |
| 3,888,698 | 6/1975 | Lindmayer et al. | 136/89 |
| 3,978,509 | 8/1976 | Gouin et al. | 357/30 |
| 3,990,097 | 11/1976 | Lindmayer | 357/30 |
| 3,990,101 | 11/1976 | Ettenberg et al. | 357/30 |

FOREIGN PATENT DOCUMENTS

1,446,472  6/1966  France.

OTHER PUBLICATIONS

P. A. Iles et al., "Improved Performance From Thin Silicon Solar Cells," 10th *IEEE Photovoltaic Specialists Conf.*, (1973), pp. 200–206.

W. P. Rahilly, "Hardened Solar Cells," *Conf. Record.*, 7th *IEEE Photospecialists Conf.*, Nov. 1968, pp. 82–84.
J. J. Cuomo et al., "Total Photon Absorption Solar Cells," *IBM Tech. Disc. Bull.*, vol. 18, p. 935, Aug. 1975.
P. M. Dunbar et al., "Efficiency of Si Solar Cells As A Function of Base Layer Resistivity," 11th *IEEE Photovoltaic Specialists Conf.* pp. 13–18 (1975) (May).
P. A. Iles et al., "Effect of Impurity Doping Concentration on Solar Cell Output," 11th *IEEE Photovoltaic Specialists Conf.* (1975)(May) pp. 19–24.

*Primary Examiner*—John H. Mack
*Assistant Examiner*—Aaron Weisstuch
*Attorney, Agent, or Firm*—Sughrue, Rothwell, Mion, Zinn and Macpeak

[57] ABSTRACT

A solar cell is constructed such that the losses resulting from radiation damage are reduced without sacrificing efficiency in the unirradiated cell. This is done by using a first conductivity type junction on the front of a high resistivity cell and a second, opposite conductivity type junction on the back of the cell. The two junctions are separated by an intrinsic region, and the cell potential, which is normally reduced by using high resistivity substrate material, is instead raised by using the second junction. The cell includes a reflective back surface and a non-reflective front surface to further enhance light absorption within the active cell volume. The reflective back surface is formed by polishing the substrate. The nonreflective front surface is a multi-pyramidal or V-grooved surface formed by preferential etching of the substrate material. The front electrode is a fine geometry grid deposited over the front surface of the cell. An anti-reflection coating may additionally be provided over the front surface of the cell to further promote the non-reflective characteristics of that surface. Further, a cover slide may be cemented to the front surface of the cell.

10 Claims, 1 Drawing Figure

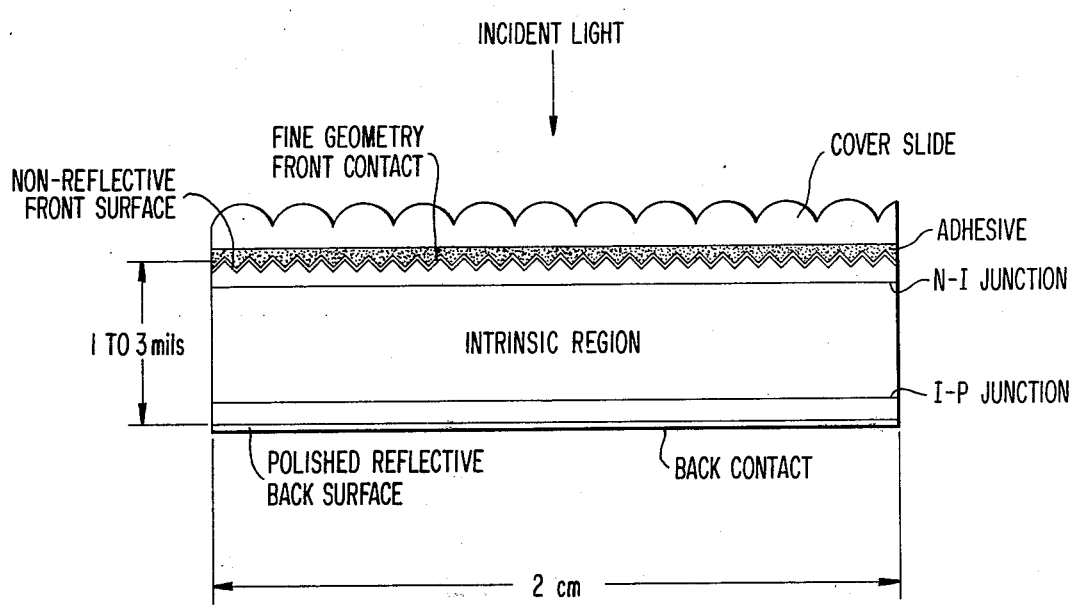

RADIATION HARDENED P-I-N AND N-I-P SOLAR CELLS

BACKGROUND OF THE INVENTION

This is a Continuation-In-Part of application Ser. No. 634,221 filed Nov. 21, 1975, now abandoned.

The present invention generally relates to junction solar cells, and more particularly, to radiation hardened P-I-N and N-I-P solar cells which exhibit high efficiency and a significant reduction in the susceptibility to radiation damage.

In order to obtain higher efficiency solar cells, higher doping levels in the substrate have been employed so as to raise the open circuit voltage ($V_{oc}$) of the solar cell by reducing the saturation current. In the process of raising this doping level, the number of recombination centers formed from a given level of radiation was also raised, thereby making the cell more easily degraded in a radiation environment. Therefore, current practice in the fabrication of junction solar cells is a tradeoff between high initial efficiency and low radiation degradation. More specifically, the substrate is typically only modestly doped (to a resistivity between two and ten $\Omega$ cm p-Si substrates), thus sacrificing initial efficiency in order to keep end-of-life efficiency as high as possible.

SUMMARY OF THE INVENTION

The present invention is directed to a modified solar cell which is constructed such that the losses resulting from radiation damage are reduced without sacrificing efficiency in the unirradiated cell. The radiation sensitivity is decreased by using an n-type junction on the front of a high resistivity cell and a p-type junction on the back. Alternatively, a p-type junction can be used on the front and an n-type junction on the back of the solar cell. The two junctions are separated by an intrinsic region, and the cell potential, which is normally reduced by using high resistivity substrate material, is instead raised by using the second junction. On page 259, in *Solid State and Semiconductor Physics*, published by Harper and Row, J.P. McKelvey defines an intrinsic semiconductor as one in which electrons and holes are created primarily by thermal excitation across the energy band gap rather than from impurity levels. Such an ideal condition, obtainable only in chemically pure material, would yield an equal number of electrons and holes. In practice, high purity, undoped silicon typically has electrically active impurity concentrations in excess of one part in $10^9$ and resistivities on the order of 100 to $10^3$ $\Omega$cm. As used in this application, "intrinsic" means a range of doping approaching and including the intrinsic composition, and that the resistivity exceeds 100 $\Omega$ cm. The current collection is enhanced by the field of the back contact and the lower number of radiation induced recombination centers. Fewer of these centers are formed because there are fewer dopant atoms which can combine with radiation induced vancancies. Additionally, the cell substrate operates in a high injection mode which will increase diffusion lenght by saturating the levels associated with proton induced defect clusters. This means that point defects are reduced in number and cluster defects are less effective, resulting in significant reduction damage of the solar cell. Unfortunately, use of high resistivity material will increase the series resistance of the finished cell and thereby reduce the fill factor and cell efficiency. Reduction of cell thickness will reduce the series resistance but will also lower the light collection in the cell. The efficiency of the solar cell is maintained by the provision of a reflective back surface and a non-reflective front surface on the thin substrate. The reflective back surface, formed by polishing the substrate, reflects light back through the active volume and doubles the effective cell thickness. The non-reflective front surface is a multi-pyramidal or V-grooved surface formed by preferential etching of the silicon substrate. The junctions can be formed by wellknown technology, for example, by ion implanatation, gaseous diffusion, sintering of aluminum, proton enhanced diffusion, or diffusion from doped glasses. An n or p-type junction may be formed by gaseous diffusion of, for example, phosphorus or boron respectively. The front and back electrodes may be formed by deposition of a suitable conductor. To further enhance the non-reflecting characteristics of the front surface of the solar cell, an anti-reflection coating of, for example, $Ta_2O_5$ may be applied. Further, a conventional cover slide or one having an anti-reflection geometry may be cemented over the front surface of the cell.

BRIEF DESCRIPTION OF THE DRAWING

The specific nature of the invention, as well as other objects, aspects, uses and advantages thereof, will clearly appear in the following description and from the accompanying drawing, in which the sole FIGURE is a cross-sectional view illustrating the basic features of the present invention.

DESCRIPTION OF THE PREFERRED EMBODIMENT

An intrinsic silicon substrate of high purity having a thickness of the order of or less than the minority carrier diffusion length is diffused with a $p^+$-type junction on one face and an $n^+$-type junction on the other face with collection contacts applied to the $p^+$ and the $n^+$ faces as shown in the figures. The minority carrier diffusion length is distance traveled of a carrier between excitation and recombination. Minority carrier diffusion lengths may vary from greater than 500$\mu$ to about 50$\mu$ depending on radiation damage to the substrate. More specifically, the solar cell as illustrated in the figure is preferably manufactured according to the steps set forth hereinbelow. It will, of course, be understood by those skilled in the art that the steps listed are illustrative, being directed to a preferred method of manufacture, and that other equivalent processes may be employed to make the solar cell according to the invention.

First, an intrinsic or high resistivity single crystal silicon substrate is used as the starting material. It is important to note that material, compensated to obtain high resistivity, will not produce the desired long diffusion length and radiation resistance. The crystal is cut along the <100> crystal plane. One surface of the substrate is then polished. It is this polished surface that will become the reflective back surface of the solar cell. Next, the polished surface of the substrate is covered to protect it from later processing steps. The covering material, for example, may be vapor deposited aluminum or a doped $n$ or $p$-type glass which may be spun, sprayed or painted on the polished surface. The unpolished surface of the substrate which is to become the front surface of the solar cell is then selectively etched with a solution of hydrazine in water with a molar ratio of 1.14 to 1 of $N_2H_4/H_2O$ at 180° C. Such an etching solution is described, for example, by T. J. Rogers and J. D. Meindl in *IEEE Transactions on Electron Devices*, March 1973, at page 226, and by D. B. Lee, "Anisotropic Etching of Silicon", *Journal of Applied Physics*, Vol. 40, No. 11, October, 1969, pages 4569 to 4574. The use of this etching solution on a silicon substrate exhibiting a <100> surface results in the conversion of the surface to a multi-pyramidal surface. Alternatively, a V-grooved structure in the surface of the solar cell could be etched in accordance with the process described in application Ser. No. 615,633 filed Sept. 22, 1975 by Rittner and assigned to the assignee of the present application. In either case, the pyramid or groove formation is self-stopping, with an angle of 70° and a depth to width ratio of 0.7.

At this point, the basic qualities of reflectivity or non-reflectivity in the back and front surfaces of the ultimate solar cell have been created. The next steps in the manufacture of the solar cell according to the present invention are to form the back and front junctions in the substrate. First, the back junction may be formed by conventional ion implanatation, thermal diffusion, proton enhanced diffusion or sintering techniques to produce a $p$ or $n$-type junction. As a specific example, ion implantation of boron may be used to form a $p$-type junction close to the back surface of the solar cell. Next, the front junction of the solar cell is formed by conventional gaseous diffusion to form an $n$-type junction. It should be emphasized here that the front junction is relatively shallow, being nominally 0.10 to 0.25 microns. The back junction, if heavily doped, must also be shallow. Further, as illustrated in the figure, the preferred thickness of the substrate is relatively thin preferably being on the order of 1 to 3 mils. The substrate has to be relatively thin in view of the high resistivity of the nominally intrinsic region separating the front and back junctions. It can be said, however, that a solar cell according to the present invention having a thickness of, say 2 mils is roughly equivalent to a conventional cell having a thickness of 6 mils because the incident light is refracted by the rough, non-reflective front surface of the cell and reflected by the polished back surface of the cell.

After the two junctions have been formed in the substrate, any glass formed over the front and back surfaces during the earlier processing steps is strippped-off using well known techniques. Once this is done, the back and front collection contacts or electrodes are formed. The back electrode may cover the entire back surface of the solar cell or may be a fine geometry grid. The fine geometry grid is preferred since the angle of light refracted from the non-reflective surface is such that internal reflection from the back surface is greater where no metal coating exists. If aluminum is used as the back contact, the fine geometry is preferred since the polish of the back surface is disturbed by sintering of the aluminum during cell fabrication. The front electrode is preferably a fine geometry grid by vapor deposition through a mask or photolithographic techniques well known in the art. Such a fine geometry grid is described for example in U.S. Pat. No. Re. 28,610 to Lindmayer.

The above-described process produces the basic solar cell according to the present invention; however, further refinements are possible. Specifically, an antireflection coating of, for example, $Ta_2O_5$ may be applied to the front surface of the solar cell to further enhance its non-reflective qualities. Such an anti-reflection coating is described in application Ser. No. 438,840 filed Feb. 1, 1974 by Lindmayer et al and assigned to the assignee of this application. Further, a standard cover slide or a cover slide having an anti-reflection geometry such as that described in application Ser. No. 616,468 filed Sept. 24, 1975, by Meulenberg and assigned to the assignee of this application, may be cemented over the front surface of the solar cell.

For high cell efficiency, a high open circuit voltage $V_{oc}$, a high fill factor, and a high short-circuit current $I_{sc}$ are required. For high radiation resistance, low doping (high purity), and high bulk injection levels ($\Delta n/n$ and/or $\Delta p/p$  1) are required. The P-I-N or N-I-P cell provides $\Delta p/p$ or $\Delta n/n$  1 at air mass zero since this illumination will produce an equilibrium carrier concentration ($\Delta p$ or $\Delta n$) in excess of $10^{13}$ carriers/cm$^3$ and the doping density ($p$ or $n$) in 1,000 $\Omega$ cm $p$-type silicon is on the order of $10^{13}$/cm$^3$. The high purity material exhibits an especially long minority carrier lifetime under these high injection conditions which tends to minimize volume recombination losses in the solar cell. The high minority carrier concentration will also saturate proton or neutron produced cluster defects.

From the foregoing, it will be appreciated that the solar cell according to the present invention exhibits exceedingly good radiation resistance. A particular advantage of the solar cell according to the invention is that it also exhibits good efficiency. Specifically, $I_{sc}$ is excellent — almost all carriers generated are collected at one or the other of the junctions. $V_{oc}$ and the fill factor are somewhat less satisfactory because of the higher thermal saturation current generated within the intrinsic material. The current density-voltage equation for an N-I-P solar cell with a diffusion length L, long compared to the solar cell thickenss W, is expressed as follows:

$$J = (qn_iW/\tau) e^{q(V_p + V_n)/2kT} - J_l$$

where $n_i$ is the intrinsic carrier concentration, $\tau$ is the lifetime (at the injection level used), $V_n$ and $V_p$ are the voltage across the $n$ and $p$ junctions, respectively, and $J_l$ is the current from light injection. It we define a saturation current $J_o = qn_iW/\tau$ for the condition of no light ($J_l = 0$), then the cell open circuit voltage $V_{oc}$ under lighted conditions will be as follows:

$$V_{oc} = V_p + V_n = (2kT/q) \ln (J_l/J_o)$$

For a relatively thick cell, say on the order of 10 mils, made in accordance with the present invention, the $V_{oc}$ of the cell drops with irradiation rather than $I_{sc}$ as is the case in conventional cells. By making the cell thin, this effect is reduced so that both $V_{oc}$ and $I_{sc}$ are little affected by radiation. The result is a high efficiency, light weight, radiation hardened solar cell. The specific features of this cell in its best embodiment are the combined use of an intrinsic region with two junctions of opposite conductivity, and a reflective back surface and a non-reflective front surface in a thin cell.

It will be apparent that the embodiment shown and described is only exemplary and that various modifications can be made in construction and arrangement within the scope of the invention as defined in the appended claims. For example, while the preferred embodiment has been described in terms of intrinsic material, many advantages of the invention may be realized using somewhat lower resistivity materials.

What is claimed is:

1. A radiation hardened solar cell comprising a high purity nominally intrinsic silicon substrate having a resistivity exceeding 100 Ω cm and a thickness of less than 10 mils, said substrate having a first region of one conductivity type formed within one surface of the substrate thereby providing a first junction, and a second region of opposite conductivity type formed within the opposing surface of the substrate thereby providing a second junction, one of said surfaces forming the back surface of the solar cell and being reflective; and other of said surfaces forming the front surface of said solar cell and being non-reflective.

2. A radiation hardened solar cell as recited in claim 1, wherein said front surface is a multi-pyramidal surface.

3. A radiation hardened solar cell as recited in claim 1, wherein said front surface has formed therein a plurality of V-grooves.

4. A radiation hardened solar cell as recited in claim 1, wherein the thickness of said solar cell is in the range of 1 to 3 mils.

5. A radiation hardened solar cell as recited in claim 4, wherein said front junction has a nominal depth of 0.10 to 0.25 microns.

6. A radiation hardened solar cell as recited in claim 1, further comprising a back collection contact on the back surface of said solar cell, and a fine geometry front collection contact applied over the front surface of said solar cell.

7. A radiation hardened solar cell as recited in claim 6, further comprising an anti-reflection coating applied over said front surface.

8. A radiation hardened solar cell as recited in claim 6, further comprising a cover slide cemented over the front surface of said solar cell.

9. A radiation hardened solar cell as recited in claim 8, wherein said cover slide has an anti-reflection geometry.

10. A radiation hardened solar cell as recited in claim 6, wherein said back collection contact is a fine geometry contact.

* * * * *

UNITED STATES PATENT AND TRADEMARK OFFICE
CERTIFICATE OF CORRECTION

PATENT NO. : 4,072,541

DATED : February 7, 1978

INVENTOR(S) : Andrew MEULENBERG, Jr., John Harvey REYNOLDS

Page 1 of 2

It is certified that error appears in the above-identified patent and that said Letters Patent are hereby corrected as shown below:

Column 1, line 21 - delete "tradeoff" insert -- trade-off -- line 58 - delete "vancancies" insert -- vacancies --

Column 2, line 10 - delete "wellknown" insert -- well-known -- line 11 - delete "implanatation" insert -- implantation --

Column 3, line 22 - delete "implanatation" insert -- implantation -- line 30 - after "shallow" delete the comma line 46 - delete "strippped" insert -- stripped --

UNITED STATES PATENT AND TRADEMARK OFFICE
CERTIFICATE OF CORRECTION

PATENT NO. : 4,072,541
DATED : February 7, 1978
INVENTOR(S) : Andrew MEULENBERG, Jr., John Harvey REYNOLDS It is certified that error appears in the above-identified patent and that said Letters Patent are hereby corrected as shown below:

Column 4, line 13 - delete "$\Delta p/p \quad 1)$" insert -- $\Delta p/p \gtrsim 1)$ -- line 14 - delete "$\Delta n/n \quad 1$" insert -- $\Delta n/n \gtrsim 1$ -- line 39 - delete "$e^{q(V_p + V_n)/2kT} - J$"
insert -- $e^{q(V_p + V_n)/2kT} - J_1$ (letter)

Column 5, line 10 - after "substrate" insert -- , -- line 12 - after "  "  " -- , -- line 15 - after "reflective;" delete "and" and insert -- the --

Signed and Sealed this

Third Day of October 1978

[SEAL]

Attest:

RUTH C. MASON
*Attesting Officer*

DONALD W. BANNER
*Commissioner of Patents and Trademarks*